(12) United States Patent
Rodegheri et al.

(10) Patent No.: US 9,995,404 B2
(45) Date of Patent: Jun. 12, 2018

(54) SEAT VALVE

(71) Applicant: Buerkert Werke GmbH, Ingelfingen (DE)

(72) Inventors: Cricia de Carvalho Rodegheri, Mainz (DE); Ralf Scheibe, Kuenzelsau / Garnberg (DE); Peter Krippner, Karlsruhe (DE); Stefan Seelecke, Saarbruecken (DE)

(73) Assignee: Buerkert Werke GmbH, Ingelfingen (DE)

( * ) Notice: Subject to any disclaimer, the term of this patent is extended or adjusted under 35 U.S.C. 154(b) by 0 days. days.

(21) Appl. No.: 14/925,046

(22) Filed: Oct. 28, 2015

(65) Prior Publication Data
US 2016/0131268 A1    May 12, 2016

(30) Foreign Application Priority Data

Nov. 7, 2014  (DE) .................. 10 2014 116 295

(51) Int. Cl.
| | |
|---|---|
| *F16K 31/02* | (2006.01) |
| *F16K 7/14* | (2006.01) |
| *F16K 25/00* | (2006.01) |
| *F16K 31/00* | (2006.01) |
| *H01L 41/193* | (2006.01) |
| *H01L 41/338* | (2013.01) |
| *H01L 41/053* | (2006.01) |
| *H01L 41/09* | (2006.01) |
| *H01L 41/293* | (2013.01) |
| *H01L 41/083* | (2006.01) |

(52) U.S. Cl.
CPC .............. *F16K 7/14* (2013.01); *F16K 25/005* (2013.01); *F16K 31/007* (2013.01); *F16K 31/02* (2013.01); *H01L 41/0536* (2013.01); *H01L 41/193* (2013.01); *H01L 41/338* (2013.01); *H01L 41/083* (2013.01); *H01L 41/0973* (2013.01); *H01L 41/293* (2013.01)

(58) Field of Classification Search
CPC ........ F16K 99/0049; F16K 7/12; F16K 7/126; F16K 7/16; F16K 2099/0069; F16K 99/0053; F16K 31/007; Y10T 137/5109; Y10T 137/5196; H01L 41/083; H01L 41/0973; H01L 41/0536; H01L 41/0833
USPC ...... 251/129.01, 129.06, 331; 137/269, 270; 310/328, 800
See application file for complete search history.

(56) References Cited

U.S. PATENT DOCUMENTS 5,088,520 A * 2/1992 Haynes ............... F16K 31/0655
137/270
5,265,843 A * 11/1993 Kleinhappl ............ F16K 31/06
251/129.17

(Continued)

FOREIGN PATENT DOCUMENTS

DE  102006005517 B3  3/2007
DE  102012006359 A1  10/2012

*Primary Examiner* — Matthew W Jellett
(74) *Attorney, Agent, or Firm* — Dilworth IP LLC

(57) ABSTRACT

A seat valve (10) is described having a valve body (12) which comprises at least two fluid openings (14, 16). Furthermore, the seat valve (10) comprises at least one valve seat (20), at least one valve element (22) which can be displaced in a translatory manner and at least one actuator (24) which is formed as an electro-active polymeric actuator and cooperates with the valve element (22).

14 Claims, 5 Drawing Sheets

(56) References Cited

U.S. PATENT DOCUMENTS

| | | | | |
|---|---|---|---|---|
| 5,281,885 | A * | 1/1994 | Watanabe | F16K 31/007 251/129.01 |
| 5,501,425 | A * | 3/1996 | Reinicke | F16K 31/003 251/129.01 |
| 5,593,134 | A * | 1/1997 | Steber | F02M 59/466 137/82 |
| 7,168,675 | B2 * | 1/2007 | Cabuz | F16K 31/02 251/129.01 |
| 7,205,704 | B2 * | 4/2007 | Audren | H02N 2/043 310/328 |
| 7,250,839 | B2 * | 7/2007 | Racz | B01L 3/502738 335/215 |
| 7,490,812 | B2 * | 2/2009 | Scheibe | F16K 7/16 251/298 |
| 7,537,197 | B2 * | 5/2009 | Heim | F16K 99/0001 239/601 |
| 7,886,993 | B2 * | 2/2011 | Bachmaier | F02M 51/0603 239/102.1 |
| 7,971,850 | B2 * | 7/2011 | Heim | F16K 99/0001 239/597 |
| 2001/0038083 | A1 * | 11/2001 | Sakurai | F16K 31/007 251/129.06 |
| 2009/0250021 | A1 * | 10/2009 | Zarrabi | F01L 1/352 123/90.11 |
| 2013/0199646 | A1 * | 8/2013 | Brammer | B01L 3/502738 137/831 |
| 2016/0230904 | A1 * | 8/2016 | Zarrabi | F01L 1/352 |

* cited by examiner

SEAT VALVE

The invention relates to a seat valve having a valve body.

Valves are generally used in fluid technology to control or regulate fluids. For this purpose, the valves have a valve element which functions as a shut-off body and cooperates with a valve seat in order to block or release the through-flow through the valve or the valve body.

For this purpose, the valve element is displaced by means of an actuator. In the prior art, electromagnetic actuators are typically used which have, inter alia, a ferromagnetic coil.

The valve used in fluid technology can have different constructions. For example, some seat valves are also designated as disc valves. Seat valves are characterised by the valve element being displaced in a translatory manner, whereby a generally linear movement of the valve element takes place. So-called diaphragm valves constitute a further design, in which the valve element is not necessarily displaced in a translatory and linear manner. For example, a diaphragm valve can be formed with a rocker and so the valve element can be displaced in a rocker-like manner.

It has proved to be disadvantageous that the actuator in the valves known from the prior art also absorbs energy in the stationary state and so the energy absorption of these valves is generally high. For example, the coil of the electromagnetic actuator must be permanently activated in order to keep the valve in a position displaced from its normal position. This leads to an increased energy requirement. Furthermore, by reason of the ferromagnetic coils, valves with an electromagnetic actuator are not generally suitable for applications in the region of strong magnetic fields.

The object of the invention is to provide a seat valve which on the one hand has low energy absorption and on the other hand is formed for applications in strong magnetic fields.

This object is achieved in accordance with the invention by a seat valve having a valve body which comprises at least two fluid openings, at least one valve seat, at least one valve element which can be displaced in a translatory manner, and at least one actuator which is formed as an electro-active polymeric actuator and cooperates with the valve element.

The fundamental idea behind the invention is to design the seat valve with an actuator which is energy efficient. An electro-active polymeric actuator is such an energy-efficient actuator. The electro-active polymeric actuator typically has two flexible electrodes, between which at least one substantially incompressible polymeric layer is provided. The incompressible polymeric layer can be e.g. an incompressible elastomer. The electro-active polymeric actuator is displaced by a voltage being applied to the two flexible electrodes so that an electric field is built up between the two electrodes. The two electrodes then are attracted to each other by reason of the electric field created, whereby the incompressible polymer disposed there between expands in another direction since the volume must remain constant by reason of its incompressibility The polymeric layer thus seeks the path of least resistance and so it expands perpendicularly by the orientation of the electric field. In the direction parallel to the electric field, the polymeric layer undergoes compression. Two different ways of using this physical principle in electro-active polymeric actuators are known, in particular in dielectric elastomeric actuators. In electro-active stack actuators, the stroke is generated by the described compression in comparison to the starting condition of the stack actuator, whereas in electro-active diaphragm actuators, the mechanical expansion of the polymer by reason of the electric field created is used to displace the valve element in order to switch the seat valve accordingly. By reason of the efficiency of the electro-active polymeric actuator, only very little energy is required to displace the seat valve and so an energy-efficient seat valve is created. The efficiency of the seat valve is further increased in that, in the stationary condition, an electro-active polymeric actuator does not require any energy aside from compensating leakage currents. In a similar manner to a capacitor in which the charge is retained even after it is separated from a voltage source, in an electro-active polymeric actuator the charge and therefore the attraction force between two adjacent electrodes is retained even after the actuator has been separated from the voltage source. Furthermore, an electro-active polymeric actuator can be produced in such a way that it has no ferromagnetic material and so such a seat valve is suitable for the application in strong magnetic fields such as occur e.g. in MRT.

In particular, the displacement direction of the valve element is perpendicular to a plane which is defined by the valve seat. It is thereby ensured that the valve element presses against the valve seat in a linear and translatory manner or is raised thereby so that a through-flow is blocked or released.

One aspect of the invention makes provision for the valve element to be formed in a flexible manner, in particular as a valve diaphragm. By reason of the flexible formation of the valve element it can be ensured that this valve element closes the valve seat in a fluid-tight manner without a separate seal when it lies against the valve seat. Furthermore, the actuator can be disposed on a side of the valve element which is not in contact with media and so it is protected from the media to be switched.

In accordance with a further aspect of the invention, the actuator is formed as a diaphragm actuator or stack actuator. In this way an increased displacement stroke of the electro-active polymeric actuator can be achieved when a constant operating voltage is applied.

Furthermore, the valve element can be coupled to the actuator, in particular it can be received in the actuator. In this way, a particularly compact construction for the seat valve can be created since the actuator cooperates directly with the valve element in order to displace this valve element. It is therefore not necessary for a further element, e.g. a tappet or a rocker to be connected in between. The actuator is incorporated in particular when the valve element is formed as a valve diaphragm and so this can be designated as an active diaphragm since it is simultaneously a valve element and actuator. For this purpose, the actuator can e.g. surround the valve element in an annular manner and so the valve element is integrally formed with the actuator. This unit can be designated as an active valve diaphragm since it simultaneously comprises the valve element and the active actuator.

In particular, the cover is provided which is disposed on a flange portion of the valve body. The cover closes the valve body and so the valve body is sealed with respect to the outside. The space in which the actuator is disposed is therefore prevented from becoming contaminated.

In accordance with one aspect of the invention, the actuator is disposed on the cover or in the flange region, in particular in a groove in the cover or in the valve body. In this way the actuator can easily be changed or replaced since only the cover needs to be removed from the valve body in order to obtain access to the actuator. The groove in the valve body can be formed in particular in a peripheral manner and so the actuator is securely mounted on all sides. This is particularly advantageous when the actuator is of a circular-cylindrical shape.

In particular at least one electrical connection for the actuator is provided in the cover or in the flange region. This makes it possible to form the actuator together with the cover (and if necessary also with the valve diaphragm) as a pre-mounted assembly which is inserted into the housing. Only a plug then merely needs to be attached and the valve is ready for use.

Furthermore, a spring element can be provided which is disposed on the cover and mechanically pretensions the actuator or cooperates with the actuator, wherein in particular the spring element can be a moulded spring in the cover. A normal position of the valve element can be ensured by means of the spring provided that it acts mechanically upon the valve element. Alternatively or additionally, by means of the spring characteristics of the spring a defined displacement movement of the valve element can be set, in particular a damped movement of the valve element when this is displaced by the actuator.

A further aspect of the invention provides for a reinforcing element to lie against the valve element. This reinforcing element supports in particular the flexible valve element. By means of the reinforcing element it is ensured that the flexible valve element is uniformly displaced in a translatory manner over its whole width by the actuator.

In particular, a coating is provided on the valve element and/or on the actuator. This coating is typically applied to the side of the actuator and/or valve element facing the medium in order to protect the valve element and/or the actuator from the medium to be switched. This is particularly advantageous when aggressive media such as etching liquids are switched with the seat valve.

As an alternative to a coating, the polymeric actuator can be protected against undesirable effects of media by means of a film or an additional separating diaphragm.

Furthermore, the seat valve can be an NO valve or an NC valve. Depending on the design and arrangement of the valve element and of the actuator, the seat valve can be open or closed in its normal position.

In particular, the valve body is at least formed in such a way that the actuator, in particular the diaphragm actuator, can be installed in two installation positions and so the seat valve is an NO valve or an NC valve depending on the installation position of the actuator. It is thereby possible e.g. for the seat valve to be converted from an NO valve to an NC valve or vice versa by changing the installation of the actuator within the valve body. For this purpose, the actuator can be e.g. rotated through 180° and then inserted into the valve body. This is particularly advantageous since in this way fewer different valve types have to be stored and users can freely decide on site which type of valve is required in each case.

Further advantages and properties of the invention will be apparent from the following description and the drawings to which reference is made.

Figure 1:
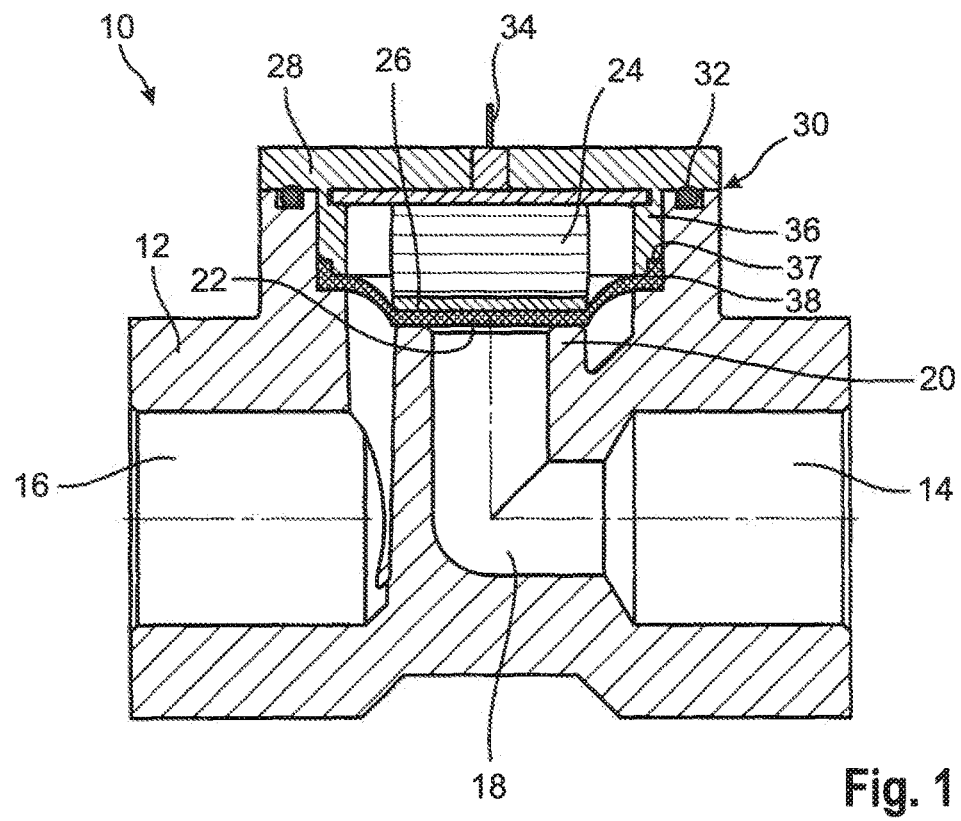
FIG. 1 shows a seat valve in accordance with the invention according to a first embodiment in a first switching position.

FIG. 1 shows a seat valve 10 according to a first embodiment in a first switching position. The seat valve 10 has a valve body 12 which is formed as one piece.

The valve body 12 has an inlet 14 and an outlet 16 which can be in flow communication with one another via a passage 18 and so a medium can flow via the inlet 14 and the passage 18 to the outlet 16.

A valve seat 20 is formed on the passage 18 and cooperates with a valve element 22 which is formed in a flexible manner in the illustrated embodiment, namely as a valve diaphragm.

The valve element 22 is displaced by an actuator 24 which is an electro-active polymeric actuator. The polymeric actuator in the illustrated embodiment is formed as a stack actuator.

Accordingly, the actuator 24 formed as a stack actuator comprises a plurality of polymeric or diaphragm layers which are each disposed between two electrodes which are allocated to a different polarity. When a voltage is applied to the actuator 24, the electrodes of different polarity allocated to a diaphragm layer are attracted to each other, whereby the diaphragm layer lying there between is compressed in the electric field direction. The diaphragm layers are generally formed from an incompressible material and so, by reason of the compression in the direction of the electric field and their incompressibility, they expand perpendicularly to the electric field direction. The compression is used to displace the valve element 22 in a translatory manner.

The more diaphragm layers the stack actuator has, the greater the displacement stroke and the force of the actuator 24 which act upon the valve element 22.

In order to transfer the movement and the force from the actuator 24 to the valve element 22 a reinforcing element 26 is provided, being disposed between one end of the actuator 24 and the valve element 22. The reinforcing element 26 is formed in a plate-like manner and is approximately the same size as the valve element 22.

Since the valve element 22 is flexible, the reinforcing element 26 serves to ensure that the valve element 22 is displaced at least in the region of the valve seat 20 in a uniform and homogeneously translatory manner by the actuator 24. The reinforcing element 26 accordingly stiffens the flexible valve element 22.

It is thereby ensured that the valve seat 20 is tightly closed by the valve element 22 and a through-flow is effectively prevented when the seat valve 10 is in the closed condition.

Furthermore, the seat valve 10 has a cover 28 which is disposed on the valve body 12 in a flange region 30 of the valve body 12.

In addition, in the flange region 30 a sealing ring 32 is provided between the valve body 12 and the cover 28 and so the interior space of the seat valve 10 is reliably sealed with respect to the external environment.

In addition, an electrical connection 34 is formed in the cover 28, which is electrically coupled to the actuator 24 and so a voltage can be applied to the actuator 24 via the electrical connection 34.

When only one contact pin is provided, the housing and/or the valve body 12 of the valve 10 serves as a ground connection. It is also possible to use two contact pins to apply voltage to the electrodes.

The cover 28 also has a peripheral collar 36 in the flange region 30 of the valve body 12, this collar protruding perpendicularly from the cover 28. The collar 36 serves to attach the edge of the flexible valve element 22.

For this purpose, the edge of the valve element 22 is clamped on the one hand against a shoulder of the valve body 12.

In addition, on the outside of the collar 36 a groove 37 is provided so that an undercut is formed in which a bead 38 engages on the outer edge of the valve element 22. In this way, the valve diaphragm 22 is held between the cover 28 and the valve body 12 in an improved manner.

In the first switching position of the seat valve 10 shown in FIG. 1, this seat valve is in its closed position. No voltage is supplied to the electro-active polymeric actuator 24 and so the seat valve 10 is an NC (normally closed) valve. For this purpose, the valve element 22 can be mechanically pretensioned e.g. by means of a spring not shown at this point. Mechanical pretensioning of the polymeric actuator 24 can also be achieved by installing the polymeric actuator compressed under voltage between the cover 28 and the valve element 22 during assembly.

Figure 2:
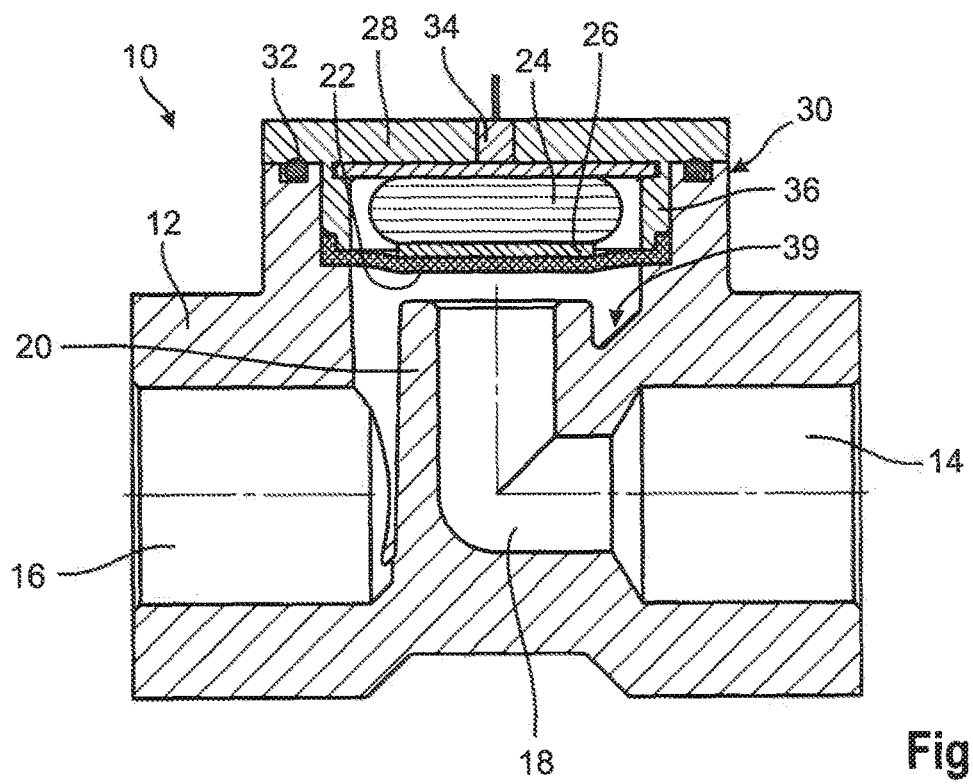
FIG. 2 shows the seat valve of FIG. 1 in a second switching position.

FIG. 2 shows the seat valve 10 of FIG. 1 in its second switching position, namely the open position, in which a voltage is applied to the actuator 24.

By reason of the applied voltage the individual diaphragm layers of the polymeric actuator 24 formed as a stack actuator are compressed in the direction of the electric field. The actuator 24 lifts the valve element 22 from the valve seat 20 in a translatory and linear manner.

By reason of the interposed plate-like reinforcing element 26 the flexible valve element 22 is uniformly raised from the valve seat 20.

In the position shown in FIG. 2, a medium can then flow via the inlet 14, through the passage 18 and via the outlet 16 through the seat valve 10.

Furthermore, a channel portion 39 is formed in the region of the valve seat 20, which is in flow communication with the outlet 16 and in particular is disposed above the outlet 16. In this way it is ensured that no residues of the medium remain in the seat valve 10 after the through-flow through the seat valve 10 has been blocked. The channel portion 39 is in particular formed in an annular manner.

Figure 3:
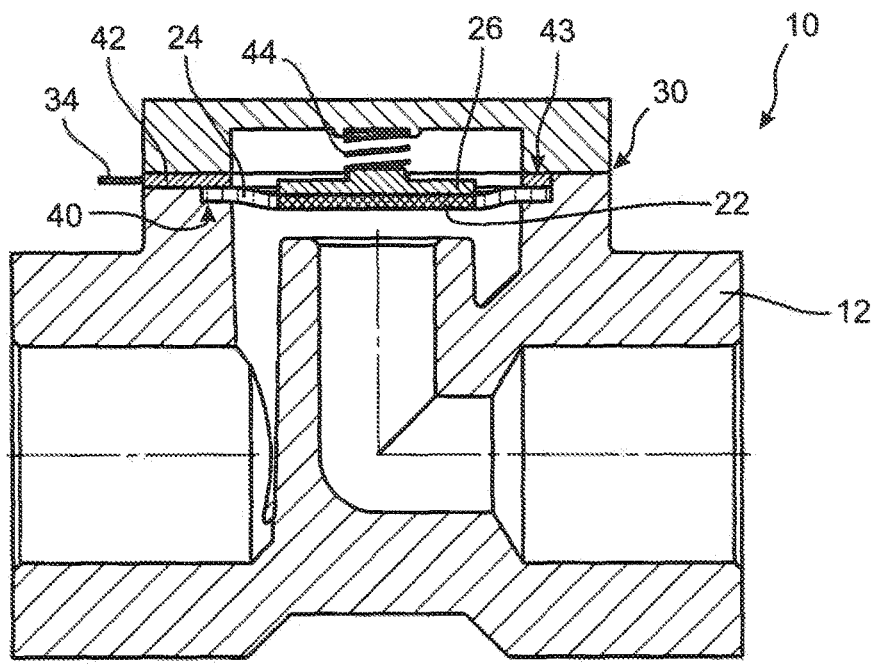
FIG. 3 shows a seat valve in accordance with the invention according to a second embodiment in a first switching position.

FIG. 3 shows a seat valve 10 in accordance with a second embodiment of the invention in its first switching position.

As shown by FIG. 3, the seat valve 10 is an NO (normally open) valve and so its first switching position is the open position of the seat valve 10.

In contrast to the first embodiment shown in FIGS. 1 and 2, the actuator 24 according to the second embodiment is not formed as a stack actuator but as a diaphragm actuator, in particular as a dielectric elastormeric actuator.

Accordingly, the actuator 24 has a diaphragm layer which is flexible whereby the actuator 24 can generate a corresponding displacement stroke.

The valve element 22 is also flexible and cooperates with the reinforcing element 26 which reinforces the valve element 22. In addition, it is thus ensured that the valve element 22 is displaced uniformly in a translatory manner.

In this embodiment, the actuator 24 is formed as a diaphragm actuator which is also annular and has a central opening. The valve element 22 which is disc-shaped, is received in this central opening. The actuator 24 accordingly encloses the valve element 22 in its starting position essentially in a plane as shown in FIG. 3. The valve element 22 and the actuator 24 therefore together form an integral unit which can be designated as an active valve diaphragm since it simultaneously controls or regulates the through-flow of the medium and can be actuated in a directly electrical manner.

In particular, the valve element 22 can be formed as one piece with the actuator 24.

The actuator 24 can be formed over the entire surface and without a central opening so that the actuator 24 and the valve element 22 are formed from a single piece of material. In this case, the actuator 24 can, as described above, by protected against undesired influences of a medium by a coating or film.

Alternatively, further geometric forms could also be provided, e.g. two rectangles, wherein the actuator 24 surrounds the valve element 22 at the edge substantially in a plane.

FIG. 3 also shows that the actuator 24 is disposed at least partially in a groove 40 in the flange region 30 of the valve body 12. For this purpose, the actuator 24 is disposed with its edge in the groove 40.

In particular, the groove 40 can be peripheral and so the actuator 24 is received with its entire edge in the groove 40.

In addition, the actuator 24 is coupled at the edge to a frame 42 which functions as a support for the flexible diaphragm actuator. The frame 42 is disposed in the flange region 30 of the valve body 12 and lies between the cover 28 and the valve body 12 such that it is fixedly held by the cover 28. The valve body 12 has in particular a receiving recess 43 for the frame 42.

Alternatively, two frames 42 can be provided, between which the diaphragm actuator 24 is held.

In the frame 42 and therefore in the flange region 30, the electric connection 34 for the actuator 24 is provided and so voltage can be applied to the actuator 24. The voltage is applied via the connection 34 to two electrodes (not shown), between which the diaphragm layer is disposed.

Furthermore, the second embodiment differs from the first embodiment in that a spring 44 is provided which bears with one end against the cover 28 and with its other end against the reinforcing element 26.

The valve element 22 is mechanically pretensioned by the spring 44.

Alternatively or additionally, the spring 44 can be used for damping the movement of the valve element 22 when this is displaced via the actuator 24.

Figure 4:
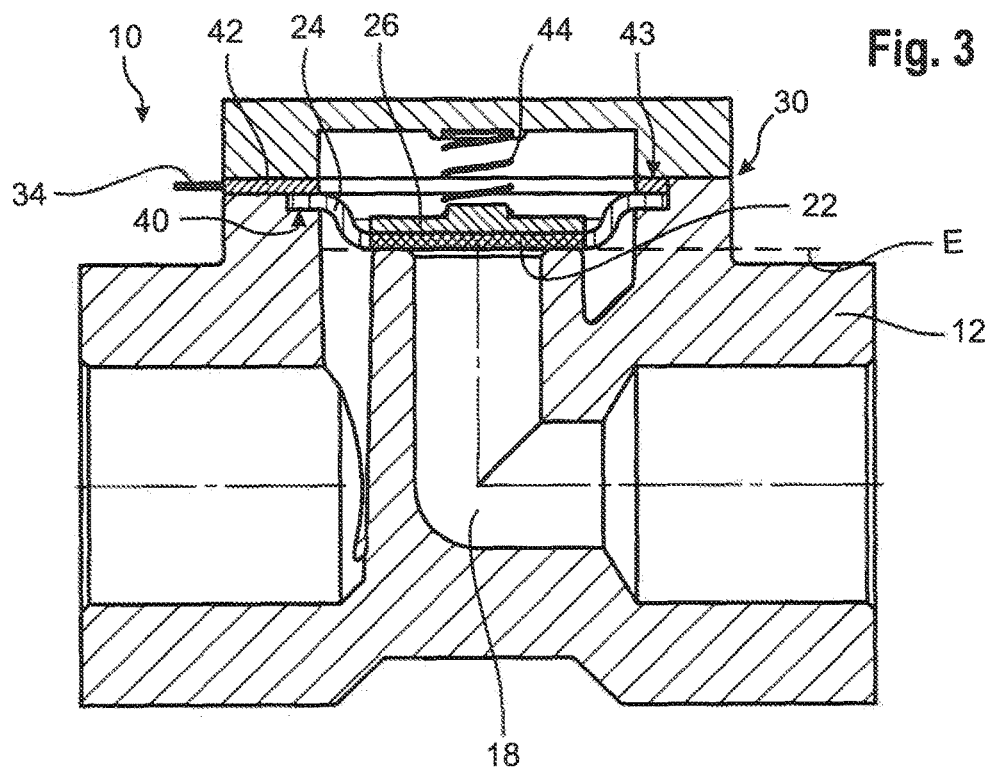
FIG. 4 shows the seat valve of FIG. 3 in a second switching position.

FIG. 4 shows the seat valve 10 of FIG. 3 in its second switching position in which a voltage is applied to the actuator 24.

The diaphragm layer of the actuator 24, which is formed from an incompressible material, is compressed by reason of the voltage in the direction of the electric field and, by reason of its incompressibility, expands perpendicularly to the electric field.

By reason of the pretensioning by the spring 44, the valve element 22 is thereby displaced in a translatory manner so that the valve element lies against the valve seat and closes it. The displacement direction of the valve element 22 is perpendicular to the plane E of the valve seat 20.

In the position shown in FIG. 4, the seat valve 10 is in a closing position and so a through-flow through the passage 18 is blocked.

If, in this position, the externally applied voltage is removed, the valve element 22 remains in this position since the actuator 24 stores the previously applied voltage like a capacitor. Only possible leakage currents of the actuator 24 must be compensated for from the outside, for which reason a particularly energy-efficient seat valve 10 is created.

The seat valve 10 is transferred from the excited or second switching position shown in FIG. 4 into its starting position or its first switching position by active reduction of the voltage in the actuator 24. In this way the electric field is reduced and the incompressible diaphragm layer relaxes so that the diaphragm layer is "shortened". In this way the valve element 22 returns to the starting position of FIG. 3 against the effect of the spring 44, and the valve is opened.

Figure 5:
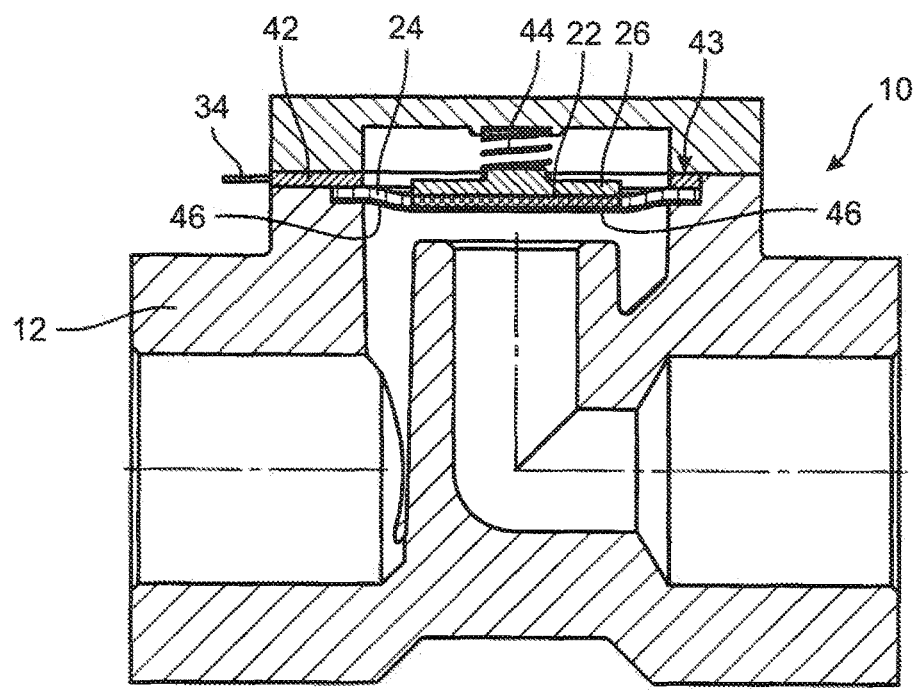
FIG. 5 shows a seat valve in accordance with the invention according to a third embodiment in a first switching position.
Figure 6:
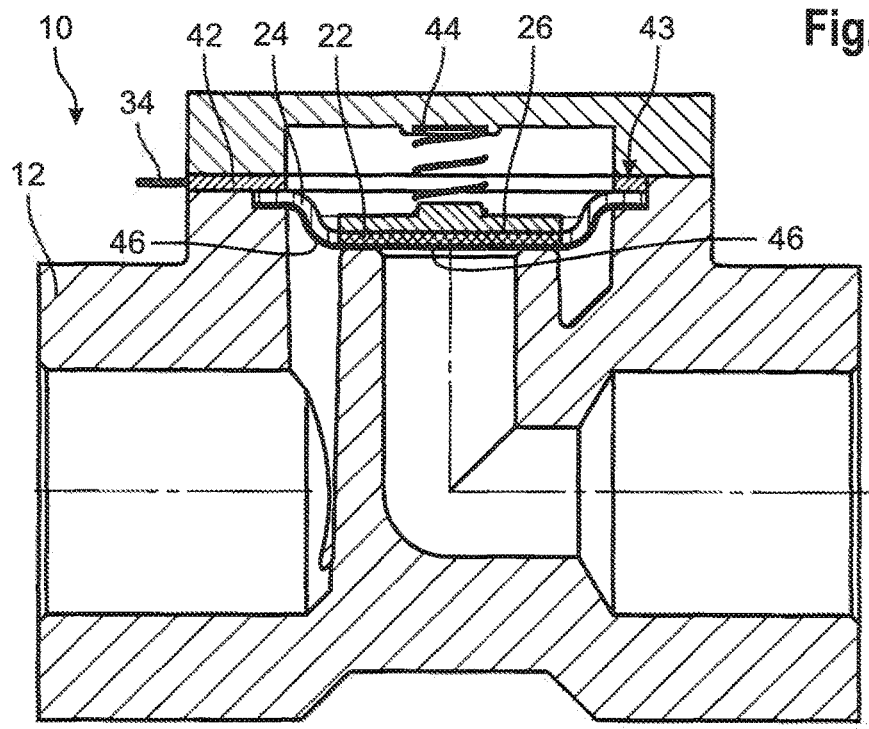
FIG. 6 shows the seat valve of FIG. 5 in a second switching position.

FIGS. 5 and 6 show a third embodiment of the seat valve 10 which is similar to the second embodiment.

The third embodiment differs from the second embodiment in that both the actuator 24 surrounding the valve element 22 in an annular manner and also the valve element 22 itself have a coating 46. Therefore the entire active valve diaphragm is coated. The coating 46 is applied to the side of the actuator 24, facing away from the cover 28, or to the valve element 22. Accordingly, the coating 46 is applied to the side of the actuator 24 or of the valve element 22 which is oriented towards the medium which flows through the seat valve 10.

The coating 46 can be a protective layer which protects both the actuator 24 and also the valve element 22 against the medium flowing through the seat valve 10. This is particularly advantageous when aggressive media are to be switched with the seat valve 10 in accordance with the invention.

The coating 46 can generally also be provided in the other embodiments.

Figure 7:
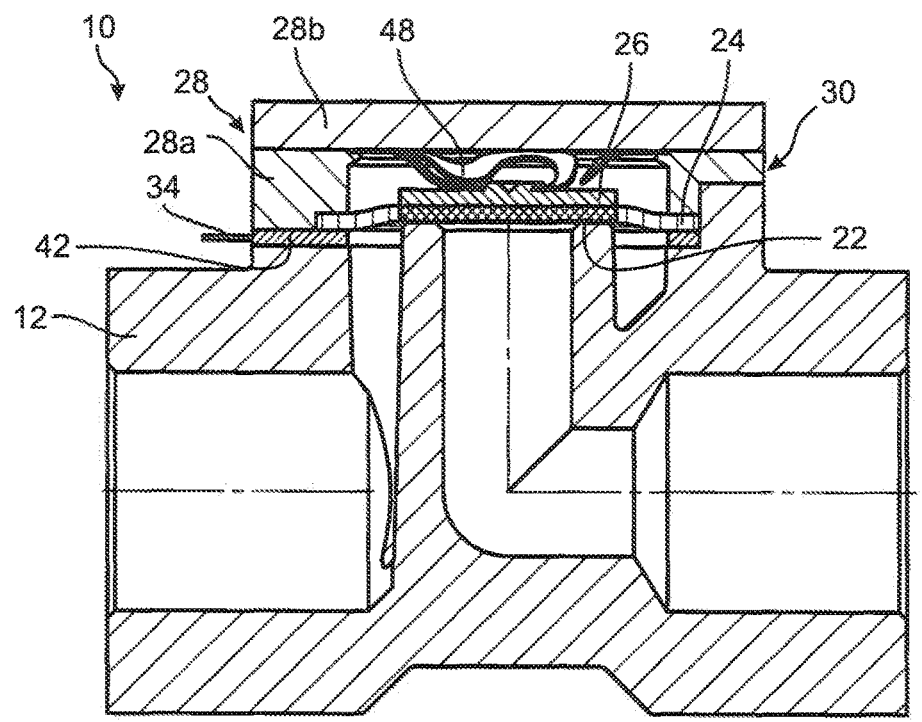
FIG. 7 shows a seat valve in accordance with the invention according to a fourth embodiment in a first switching position.

FIG. 7 shows a fourth embodiment of the seat valve 10 in which the seat valve 10 is an NC valve (i.e. a valve which is normally closed in the starting position) as shown by FIG. 7 in which the seat valve 10 is shown in its first switching position, i.e. in the position not supplied with current.

In the illustrated embodiment, the cover 28 is formed in two parts since it has a first sleeve-like cover element 28*a* and a plate-like cover element 28*b*.

The actuator 24 is also formed, in a manner analogous to the second and third embodiments, as a diaphragm actuator and is coupled to the frame 42 via its edge, which frame is in turn disposed in the flange region 30 between the valve body 12 and the cover 28.

However, the actuator 24 and the valve element 22 is disposed in the seat valve 10 oriented in reverse to the second and third embodiment and so the edge of the actuator 24 is disposed in a groove 40' in the cover 28, which groove is provided in particular in the sleeve-like cover element 28*a*.

Furthermore, a moulded spring 48 is provided in the plate-like cover element 28*b* and cooperates with the reinforcing element 26 which is in turn disposed on the flexible valve element 22.

The moulded spring 48 functions as a tension spring and so raises the valve element 22 from the valve seat 20 when the actuator 24 has a voltage applied to it and expands accordingly.

Figure 8:
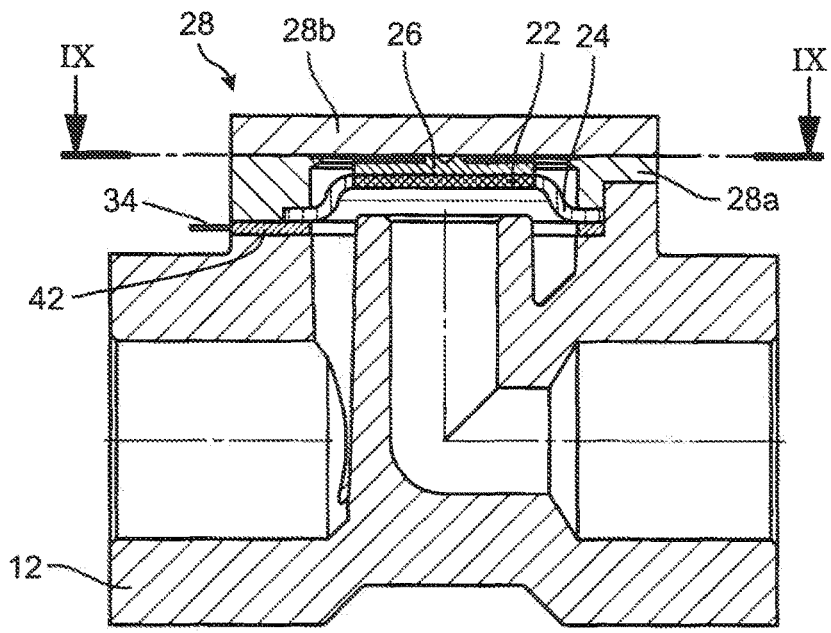
FIG. 8 shows the seat valve of FIG. 7 in a second switching position.

The seat valve 10 is transferred from the first switching position shown in FIG. 7 into the second switching position, which is shown in FIG. 8, when a voltage is applied to the actuator 24 via the electrical connection 34 which is disposed in the frame 42.

The actuator 24 then expands so that the valve element 22 coupled to the actuator 24 is raised in a translatory manner from the valve seat 20 by the moulded spring 48 formed as a tension spring.

Figure 9:
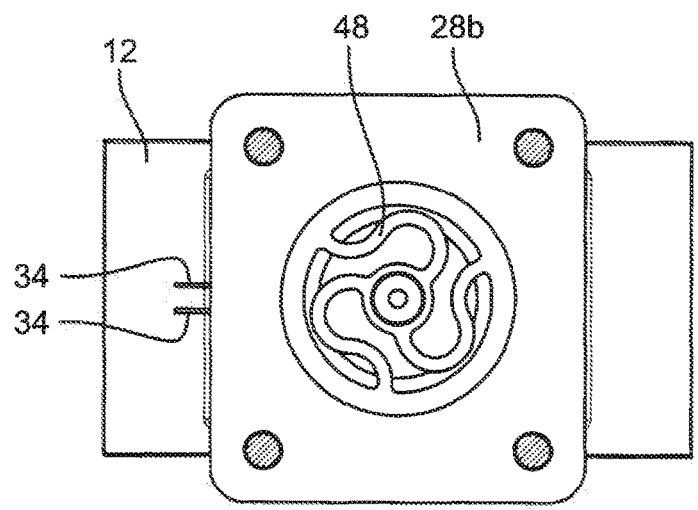
FIG. 9 shows a cross-sectional view of the seat valve from FIG. 8 along line IX-IX.

FIG. 9 shows a cross-sectional view through the plate-like cover element 28*b* in order to clarify the formation of the moulded spring 48.

Figure 10:
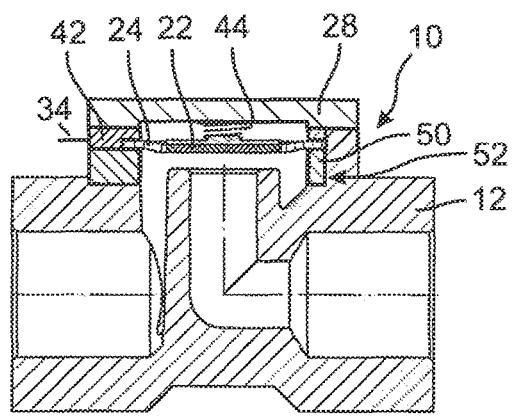
FIG. 10 shows a seat valve in accordance with the invention according to a fifth embodiment in which the valve element and the actuator are installed in a first installation position.
Figure 11:
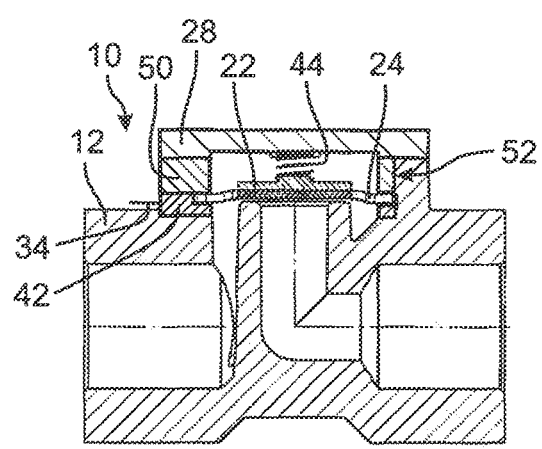
FIG. 11 shows the seat valve from FIG. 10 in which the valve element and the actuator are installed in a second installation position.

FIGS. 10 and 11 illustrate a fifth embodiment of the seat valve 10 by way of example.

This embodiment is characterised in that the actuator 24 which is formed as a diaphragm actuator and is disposed with its edge on the frame 42, can be installed in two different installation positions in the seat valve 10. Accordingly, the seat valve 10 can be converted from an NO valve to an NC valve by simple rotation of the actuator 24.

This is possible owing to the fact that an annular element 50 is provided which serves as a spacer element. Depending on the installation position of the actuator 24 or of the frame 42, the annular element 50 is disposed between the valve body 12 and the frame 42 (FIG. 10) or between the frame 42 and the cover 28 (FIG. 11).

For this purpose, the valve body 12 has a corresponding receiver 52 in order to receive both the frame 42 and also the annular body 50. The receiver 52 also forms at least partially a lateral stop for the frame 42 and the annular body 50 and so movement in the radial direction is prevented. For this purpose, the receiver 52 can be formed in particular as part of a circle.

Starting from the installation position shown in FIG. 10, the cover 28 is released from the flange region 30 of the valve body 12. Then the actuator 24 together with the frame 42 and the annular element 50 can be removed from the seat valve 10 and rotated through 180°. After rotation, the actuator 24 can be inserted into the valve body 12 in the flange region 30 together with the frame 42 and the annular element 50. For this purpose, the frame 42 with the actuator 24 and the annular element 50 can form a pre-mounting unit and so the relative positions thereof are clearly determined.

The cover 28 is then placed onto the flange region 30 and so the seat valve 10 is closed. The actuator 24 is then located in the second installation position (see FIG. 11).

FIGS. 10 and 11 each show the seat valve 10 in the state not supplied with current, from which it is clear that the seat valve 10 can be converted quickly and easily from an NC valve (FIG. 10) to an NO valve (FIG. 11).

For this purpose, however, the spring 44 must be exchanged, wherein in the specific example the compression spring (FIG. 10) must be replaced by a tension spring (FIG. 11). This can be effected either in that a cover 28 is provided with a tension spring instead of a cover 28 with a compression spring for the second installation position or in that the same cover 28 is used and only the spring 44 is exchanged.

This embodiment has been presented using the example of a seat valve 10 which is formed in a similar manner to the second embodiment. However, this is also generally possible with the other embodiments, in particular the third and fourth embodiments of the seat valve 10.

The seat valve 10 in accordance with the invention can by formed without ferromagnetic components by reason of the electro-active polymeric actuator, whereby the seat valve 10 is suitable for applications with strong magnetic fields such as in MRT. For this purpose, the valve body 12 and the cover 28 are produced from a non-ferromagnetic material, e.g. from a synthetic material, in particular an injection moulded material.

Furthermore, the spring 44 can likewise be produced from a non-ferromagnetic material.

The valve element 22 can generally be formed from an elastomeric material and so is an elastomeric seal.

A seat valve 10 is thus created in accordance with the invention, which has particularly low energy absorption and is also suitable for applications with strong magnetic fields.

The invention claimed is:

1. A seat valve comprising a valve body and a cover disposed on a flange portion of the valve body to close the valve body so that the valve body is sealed to prevent contamination from outside, which valve body comprises at least two fluid openings and at least one valve seat, wherein the seat valve further comprises at least one valve element, which valve element is a diaphragm formed as one piece, is flexible and can be displaced in a translatory manner, and at least one actuator, which-actuator is formed as an electro-active polymeric actuator and cooperates with the valve element, wherein the valve element which is flexible and can be displaced in a translatory manner closes the valve seat in a fluid-tight manner without a separate seal when it lies against the valve seat, and wherein the seat valve is configured such that the actuator can be installed in two different installation positions in the seat valve such that the seat valve can be converted from a normally open valve to a normally closed valve depending on the installation position of the actuator.

2. The seat valve according to claim 1, wherein the displacement direction of the valve element is perpendicular to a plane defined by the valve seat.

3. The seat valve according to claim 1, wherein the actuator is formed as a diaphragm actuator or as a stack actuator.

4. The seat valve according to claim 1, wherein the valve element is directly coupled to the actuator.

5. A seat valve according to claim 1 wherein the at least one valve element and lies on a reinforcing element formed in a plate-like manner, and wherein the valve element is integrated in the actuator such that an active valve diaphragm is provided that serves as the valve element and the actuator simultaneously.

6. The seat valve according to claim 5, wherein at least one electrical connection for the actuator is provided in the cover or in the flange region.

7. The seat valve according to claim 3, wherein the actuator is disposed on the cover or in the flange region.

8. The seat valve according to claim 7, wherein the actuator is disposed in a groove in the cover or in the valve body.

9. The seat valve according to claim 5, wherein a spring element is provided which bears with one end against the cover and with its other end against the reinforcing element so that the spring element mechanically pretensions the actuator or cooperates with the actuator.

10. The seat valve according to claim 7, wherein a spring element is provided which is disposed on the cover and mechanically pretensions the actuator or cooperates with the actuator.

11. The seat valve according to claim 1, wherein a reinforcing element is provided on which the valve element lies.

12. The seat valve according to claim 1, wherein a coating is provided on the valve element and/or is provided on the actuator.

13. The seat valve according to claim 5, wherein a coating is provided on the valve element and/or is provided on the actuator.

14. The seat valve according to claim 1 wherein the actuator is coupled at the edge to a frame which functions as a support for the flexible diaphragm actuator, wherein an annular element is provided that, depending on the installation position of the actuator, is disposed between the valve body and the frame or between the frame and the cover.

* * * * *